US008643056B2

(12) United States Patent
Kimura et al.

(10) Patent No.: US 8,643,056 B2
(45) Date of Patent: Feb. 4, 2014

(54) POWER SEMICONDUCTOR DEVICE AND METHOD OF MANUFACTURING THE SAME

(75) Inventors: Kiyoshi Kimura, Hyogo-ken (JP); Yasuto Sumi, Hyogo-ken (JP); Hiroshi Ohta, Hyogo-ken (JP); Hiroyuki Irifune, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 187 days.

(21) Appl. No.: 13/229,203

(22) Filed: Sep. 9, 2011

(65) Prior Publication Data

US 2012/0061721 A1    Mar. 15, 2012

(30) Foreign Application Priority Data

Sep. 10, 2010 (JP) ................................ 2010-203423

(51) Int. Cl.
*H01L 29/66* (2006.01)

(52) U.S. Cl.
USPC .................. 257/133; 257/329; 257/E27.055; 257/E21.383; 257/E21.41

(58) Field of Classification Search
USPC .................. 257/133, 329, E29.257, E27.055, 257/E21.41, E21.383
See application file for complete search history.

(56) References Cited

U.S. PATENT DOCUMENTS

| 7,317,225 B2 * | 1/2008 | Saito et al. ..................... 257/341 |
| 2011/0018055 A1 | 1/2011 | Ohta et al. |
| 2011/0233656 A1 | 9/2011 | Ohta et al. |
| 2012/0273871 A1 * | 11/2012 | Yedinak et al. ............... 257/329 |

FOREIGN PATENT DOCUMENTS

JP    2007-036213    2/2007

OTHER PUBLICATIONS

Japanese Office Action dated Jan. 23, 2013, filed in counterpart Application No. 2010-203423, 3 pages (in English and Japanese).

\* cited by examiner

*Primary Examiner* — Stephen W Smoot
*Assistant Examiner* — Vicki B Booker
(74) *Attorney, Agent, or Firm* — Patterson & Sheridan, LLP (57) ABSTRACT

A power semiconductor device includes a first semiconductor layer of a first conductivity type, a first drift layer, and a second drift layer. The first drift layer includes a first epitaxial layer of the first conductivity type, a plurality of first first-conductivity-type pillar layers, and a plurality of first second-conductivity-type pillar layers. The second drift layer is formed on the first drift layer and includes a second epitaxial layer of the first conductivity type, a plurality of second second-conductivity-type pillar layers, a plurality of second first-conductivity-type pillar layers, a plurality of third second-conductivity-type pillar layers, and a plurality of third first-conductivity-type pillar layers. The plurality of second second-conductivity-type pillar layers are connected to the first second-conductivity-type pillar layers. The plurality of second first-conductivity-type pillar layers are connected to the first first-conductivity-type pillar layers. The plurality of third second-conductivity-type pillar layers are arranged on the first epitaxial layer.

13 Claims, 7 Drawing Sheets

FIG. 10

POWER SEMICONDUCTOR DEVICE AND METHOD OF MANUFACTURING THE SAME

CROSS-REFERENCE TO RELATED APPLICATION

This application is based upon and claims the benefit of priority from the prior Japanese Patent Application No. 2010-203423, filed on Sep. 10, 2010; the entire contents of which are incorporated herein by reference.

FIELD

Embodiments described herein relate generally to a semiconductor device such as a power MOSFET and a method for manufacturing the same.

BACKGROUND

The on-resistance of a power MOSFET (metal oxide semiconductor field effect transistor) is determined by the impurity concentration of the drift layer. If the impurity concentration is increased to reduce the on-resistance, the depletion layer does not sufficiently extend from the base layer into the drift layer. This decreases the breakdown voltage. That is, there is a tradeoff between the on-resistance and the breakdown voltage. A solution to this problem is a super junction structure in which n-pillar layers and p-pillar layers are alternately and repeatedly arranged in the horizontal direction. By achieving the balance between the amount of n-type impurity in the n-pillar layer and the amount of p-type impurity in the p-pillar layer, the super junction structure is likely to be completely depleted. Thus, a non-doped layer is artificially formed. Hence, even if the impurity concentration of each pillar layer is increased to reduce the on-resistance, the decrease of the breakdown voltage of the MOSFET can be suppressed. The power MOSFET includes a device section in which the current flows, and a termination section formed in the outer peripheral portion of the chip around the device section. By causing avalanche earlier in the device section having high avalanche withstand capability, the power MOSFET can be prevented from destruction. Also in the power MOSFET including the super junction structure, it is desired that the breakdown voltage be higher in the termination section than in the device section.

DETAILED DESCRIPTION

A power semiconductor device includes a device section and a termination section. A current flows in a vertical direction between a first electrode and a second electrode opposed to each other in the device section. The termination section surrounds the device section in a horizontal plane orthogonal to the vertical direction. The power semiconductor device includes a first semiconductor layer of a first conductivity type, a first drift layer, a second drift layer, a plurality of second-conductivity-type base layers, a first-conductivity-type source layer, and a gate electrode. The first drift layer is formed on the first semiconductor layer and includes a first epitaxial layer of the first conductivity type, a plurality of first first-conductivity-type pillar layers, and a plurality of first second-conductivity-type pillar layers. The first epitaxial layer has a lower concentration of first-conductivity-type impurity than the first semiconductor layer. The plurality of first first-conductivity-type pillar layers and the plurality of first second-conductivity-type pillar layers are alternately and repeatedly arranged in a first direction parallel to the horizontal plane only in the device section in the first epitaxial layer. The plurality of first first-conductivity-type pillar layers have a higher concentration of the first-conductivity-type impurity than the first epitaxial layer. The second drift layer is formed on the first drift layer and includes a second epitaxial layer of the first conductivity type, a plurality of second second-conductivity-type pillar layers, a plurality of second first-conductivity-type pillar layers, a plurality of third second-conductivity-type pillar layers, and a plurality of third first-conductivity-type pillar layers. The second epitaxial layer of the first conductivity type has a higher concentration of the first-conductivity-type impurity than the first epitaxial layer. The plurality of second second-conductivity-type pillar layers are spaced along the first direction in the device section in the second epitaxial layer and are connected to the first second-conductivity-type pillar layers. The plurality of second first-conductivity-type pillar layers are made of the second epitaxial layer sandwiched between adjacent ones of the second second-conductivity-type pillar layers and are connected to the first first-conductivity-type pillar layers. The plurality of third second-conductivity-type pillar layers are spaced along the first direction in the termination section in the second epitaxial layer and are arranged on the first epitaxial layer. The plurality of third first-conductivity-type pillar layers are made of the second epitaxial layer sandwiched between adjacent ones of the third second-conductivity-type pillar layers and are arranged on the first epitaxial layer. The plurality of second-conductivity-type base layers are selectively formed in a surface of the second drift layer in the device section and are electrically connected to the second second-conductivity-type pillar layers. The first-conductivity-type source layer is selectively formed in a surface of the second-conductivity-type base layer. The gate electrode is formed via a gate insulating film on the source layer, the base layer, and the second first-conductivity-type pillar layer. The first electrode is electrically connected to a surface of the first semiconductor layer on opposite side of the first drift layer.

The second electrode is electrically connected to the source layer and the base layer.

Embodiments of the invention will now be described with reference to the drawings. The figures used in describing the embodiments are schematic for ease of description. In actual practice, the shape, dimension, and size relation of components in the figures are not necessarily identical to those shown in the figures, but can be suitably modified as long as the effect of the invention is achieved. Although it is assumed in this description that the first conductivity type is n-type and the second conductivity type is p-type, these conductivity types can be interchanged. Although silicon is taken as an example of semiconductor, the embodiments are also applicable to compound semiconductors such as silicon carbide (SiC) and gallium nitride (GaN). Although silicon oxide film (SiO$_2$) is taken as an example of insulating film, it is also possible to use other insulators such as silicon nitride (SiN), silicon oxynitride (SiNO), and alumina (Al$_2$O$_3$). In the case where the n-type conductivity is denoted by n$^+$, n, and n$^-$, it is assumed that the n-type impurity concentration decreases in this order. Also with regard to p-type, it is assumed that the p-type impurity concentration decreases in the order of p$^+$, p, and p$^-$.

First Embodiment

Figure 1:
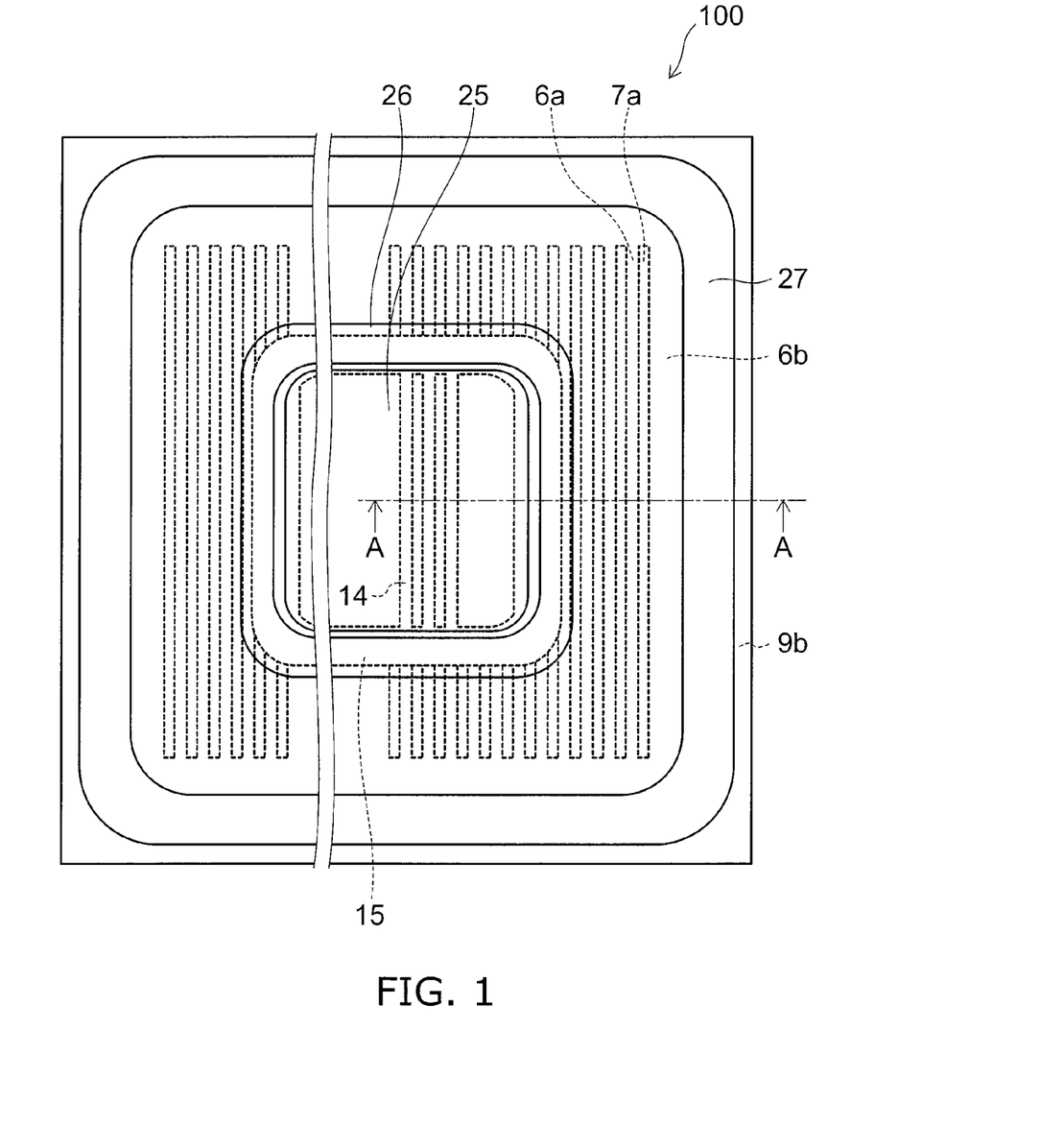
FIG. 1 is a top view of the chip of a power semiconductor device according to a first embodiment as viewed from above.
Figure 2:
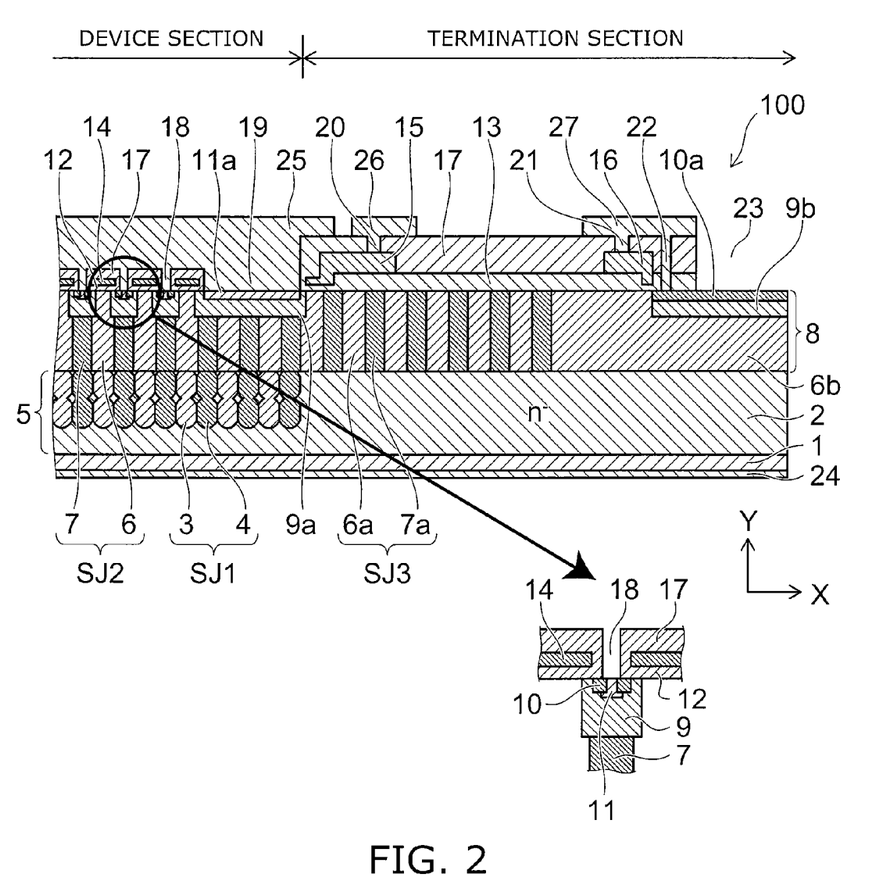
FIG. 2 is a main part sectional view of the power semiconductor device according to the first embodiment, showing a cross section taken along A-A of FIG. 1.

A first embodiment is described with reference to FIGS. 1 and 2. FIG. 1 is a top view of the chip of a power semiconductor device according to the first embodiment as viewed from above. FIG. 2 is a main part sectional view of the power semiconductor device according to the first embodiment, showing a cross section taken along A-A of FIG. 1.

The power semiconductor device 100 according to the first embodiment is an n-type channel MOSFET (Metal Oxide Semiconductor Field Effect Transistor). The power semiconductor device 100 includes an n$^+$-type (first-conductivity-type) drain layer (first semiconductor layer) 1, a first drift layer 5, a second drift layer 8, a gate electrode 14, a drain electrode (first electrode) 24, and a source electrode (second electrode) 25. The power semiconductor device 100 includes a device section and a termination section. In the device section, a current controlled by the gate electrode 14 flows from the drain electrode 24 toward the source electrode 25 opposed thereto in the Y direction (vertical direction) in the figure. The termination section has a ring-shaped structure surrounding the device section in the horizontal plane. That is, the device section internally includes a MOSFET cell region in which the gate electrode controls the current flowing from the drain electrode 24 to the source electrode 25. The termination section does not include the MOSFET cell region, but surrounds the device section outside the MOSFET cell region.

The first drift layer 5 is formed on the n$^+$-type drain layer 1 made of silicon. The n-type impurity concentration of the n$^+$-type drain layer 1 can be set on the order of e.g. 10$^{19}$/cm$^3$. The first drift layer 5 includes an n$^+$-type first epitaxial layer 2 made of silicon, first n-type (first-conductivity-type) pillar layers 3 made of silicon, and first p-type (second-conductivity-type) pillar layers 4 made of silicon. The n$^-$-type first epitaxial layer 2 is a low impurity concentration layer having a lower n-type impurity concentration than the first semiconductor layer 1. The n-type impurity concentration of the n$^-$-type first epitaxial layer 2 is e.g. 10$^{13}$–10$^{14}$/cm$^3$. The n$^-$-type first epitaxial layer 2 is formed on the first semiconductor layer 1. The first n-type pillar layer 3 has a higher n-type impurity concentration than the first epitaxial layer 2. Only in the device section in the first epitaxial layer 2, the first n-type pillar layers 3 and the first p-type pillar layers 4 are alternately and repeatedly arranged in the X direction (first direction parallel to the horizontal plane) in the figure to form a first super junction SJ1. The first super junction SJ1 is formed so that the amount of n-type impurity of the first n-type pillar layer 3 is equal to the amount of p-type impurity of the first p-type pillar layer 4. Because the amount of impurity of the first n-type pillar layer 3 is equal to that of the first p-type pillar layer 4, they are both likely to be completely depleted under application of reverse bias, and artificially function like a low impurity concentration layer. In the termination section in the first epitaxial layer 2, the first n-type pillar layer 3 and the first p-type pillar layer 4 are not formed.

In the termination section of the first epitaxial layer 2, the first epitaxial layer is left intact as a low impurity concentration layer.

The first n-type pillar layer 3 is formed from a plurality of first n-type layers (first-conductivity-type layers) coupled to each other in the Y direction. The plurality of first n-type layers have a maximum of n-type impurity concentration inside or in the central portion of each first n-type layer in the Y direction. Furthermore, in the coupling portion of the plurality of first n-type layers, the n-type impurity concentration has a minimum. That is, the first n-type pillar layer 3 has an impurity concentration distribution with maxima and minima of impurity concentration repeated along the Y direction. The aforementioned first n-type layer is a diffusion layer having a maximum of n-type impurity concentration inside or in the central portion thereof, and formed by ion implantation and heat treatment. In this embodiment, the first n-type pillar layer 3 is composed of two first n-type layers.

The first p-type pillar layer 4 is formed from a plurality of p-type layers (second-conductivity-type layers) coupled to each other in the Y direction. The plurality of p-type layers have a maximum of p-type impurity concentration inside or in the central portion of each p-type layer in the Y direction. Furthermore, in the coupling portion of the plurality of p-type layers, the p-type impurity concentration has a minimum. That is, the p-type pillar layer 4 has an impurity concentration distribution with maxima and minima of impurity concentration repeated along the Y direction. The aforementioned p-type layer is a diffusion layer having a maximum of p-type impurity concentration inside or in the central portion thereof, and formed by ion implantation and heat treatment. In this embodiment, the first p-type pillar layer 4 is composed of two p-type layers.

In this embodiment, as an example, the thickness of the first epitaxial layer 2 is 30 μm. The maxima of n-type impurity concentration of the first n-type layers are located at depths of approximately 5 μm and approximately 15 μm from the surface of the first epitaxial layer 2. Two n-type layers are coupled in the Y direction by diffusion to form the first n-type pillar layer 3. Like the first n-type layers, the maxima of p-type impurity concentration of the p-type layers are located at depths of approximately 5 μm and approximately 15 μm from the surface of the first epitaxial layer 2. Two p-type layers are coupled in the Y direction by diffusion to form the first p-type pillar layer 4. The bottom of the first n-type pillar layer 3 and the first p-type pillar layer 4 is determined by the degree of diffusion of the first n-type layer and the p-type layer. The bottom is located at a depth of e.g. approximately 20-25 μm from the surface of the first epitaxial layer. That is, the thickness in the Y direction of the first n-type pillar layer 3 and the first p-type pillar layer 4 is approximately 20-25 μm. Here, the first n-type pillar layer 3 and the first p-type pillar layer 4 may be formed so as to reach the n$^+$-drain layer 1 depending on the design.

The second drift layer 8 is formed on the first drift layer 5. The second drift layer 8 includes an n-type second epitaxial layer 6b, second n-type pillar layers 6, second p-type pillar layers 7, third n-type pillar layers 6a, and third p-type pillar layers 7a, each made of silicon. The n-type second epitaxial layer 6b is formed on the first drift layer 5. The n-type second epitaxial layer 6b has a higher n-type impurity concentration than the first epitaxial layer 2. For instance, the n-type impurity concentration of the n-type second epitaxial layer 6b is 10$^{15}$–10$^{16}$/cm$^3$. The thickness of the n-type second epitaxial layer 6b is e.g. 20 μm.

In the device section in the second epitaxial layer 6b, the second p-type pillar layers 7 are spaced along the X direction with the same spacing as the first p-type pillar layers 4, and electrically connected to the first p-type pillar layers 4. The second n-type pillar layer 6 is made of the second epitaxial layer 6b sandwiched between adjacent second p-type pillar layers 7, and connected to the first n-type pillar layer 3. The second n-type pillar layers 6 and the second p-type pillar layers 7 are repeatedly arranged in the first direction in the device section to form a second super junction SJ2. Like the first n-type and p-type pillar layers, the second n-type and p-type pillar layers are formed so that the amounts of n-type and p-type impurity of these pillar layers are equal.

In the termination section in the second epitaxial layer 6b, the third p-type pillar layers 7a are spaced along the X direction and arranged on the first epitaxial layer 2. The third n-type pillar layer 6a is made of the second epitaxial layer 6b sandwiched between adjacent third p-type pillar layers 7a, and arranged on the first epitaxial layer 2. The third n-type pillar layers 6a and the third p-type pillar layers 7a are repeatedly arranged in the first direction in the termination section to form a third super junction SJ3.

Like the first n-type and p-type pillar layers, the third n-type and p-type pillar layers are formed so that the amounts of n-type and p-type impurity of these pillar layers are equal. The second p-type pillar layer 7 and the third p-type pillar layer 7a can be formed as a diffusion layer like the first p-type pillar layer 4. However, in this embodiment, by way of example, as in the manufacturing method described later, the second p-type pillar layer 7 and the third p-type pillar layer 7a are made of buried layers formed in a first trench and a second trench, respectively, formed in the second epitaxial layer 6b and reaching the first drift layer. Hence, the thickness in the Y direction of the second n-type pillar layer 6, the second p-type pillar layer 7, the third n-type pillar layer 6a, and the third p-type pillar layer 7a is equal to the thickness of the second epitaxial layer 6b, i.e., 20 μm.

Furthermore, in this embodiment, the second n-type pillar layer 6 and the third n-type pillar layer 6a are like n-type pillar layers, identical in the width in the X direction and the amount of impurity. Likewise, the second p-type pillar layer 7 and the third p-type pillar layer 7a are like p-type pillar layers, identical in the width in the X direction and the amount of impurity.

Figure 3:
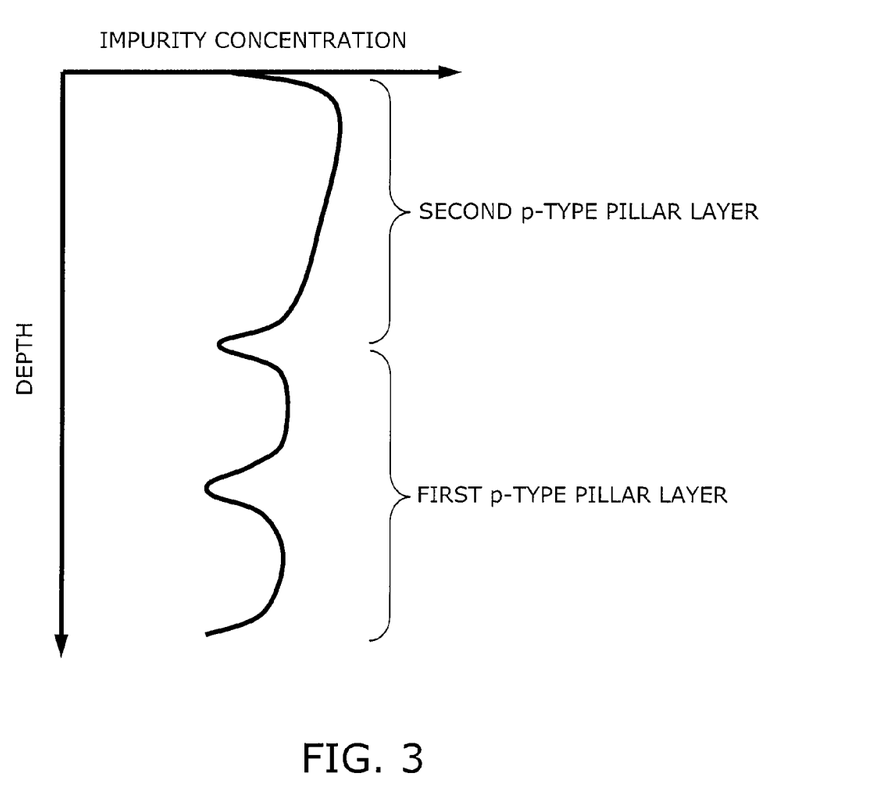
FIG. 3 is a concentration distribution of p-type impurity along the Y direction in a first p-type pillar layer 4 and a second p-type pillar layer 7 in a device section shown in FIG. 2.

FIG. 3 shows a concentration distribution of p-type impurity along the Y direction in the first p-type pillar layer 4 and the second p-type pillar layer 7 in the device section shown in FIG. 2. The profile of this concentration distribution can be obtained by analysis based on e.g. secondary ion mass spectroscopy (SIMS). In the first p-type pillar, the p-type impurity concentration has a maximum inside or in the central portion of the p-type layer, and a minimum in the coupling portion of the p-type layers adjacent in the Y direction. That is, the concentration distribution of p-type impurity in the first p-type pillar layer has a plurality of maxima, as many as the number of p-type layers. In the second p-type pillar layer 7, unlike the first p-type pillar layer, the concentration distribution of p-type impurity does not have a plurality of maxima. That is, the second p-type pillar layer 7 is made of a single p-type semiconductor layer, not intended for concentration variation of p-type impurity. In this embodiment, as an example, the p-type impurity concentration of the second p-type pillar layer 7 monotonically increases toward the p-type base layer 9 described below, and does not have a plurality of maxima. Although not shown, the foregoing also applies to the concentration distribution of n-type impurity of the first n-type pillar layer and the second n-type pillar layer.

In the device section, a p-type base layer 9 is formed in the surface of the second drift layer 8 and connected to the second p-type pillar layer 7. At the boundary between the device section and the termination section, a p-type base layer 9a is formed in the surface of the second drift layer 8 and connected to the second p-type pillar layer 7. The p-type base layer 9a is formed with a wider width in the X direction than the p-type base layer 9 of the device section. In the termination section, adjacent to the portion to be formed into the chip end portion by dicing, a p-type base layer 9b is formed in the surface of the second epitaxial layer 6b. The p-type base layers 9, 9a, 9b are made of silicon.

An $n^+$-source layer 10 is selectively formed in the surface of the p-type base layer 9 of the device section. Adjacent to the chip end portion of the termination section, an $n^+$-source layer 10a is formed in the surface of the p-type base layer 9b. The $n^+$-source layers 10, 10a are made of silicon. A gate electrode 14 is formed via a gate insulating film 12 on the $n^+$-source layer 10, the p-type base layer 9, and the second n-type pillar layer 6. For instance, the gate electrode 14 can be formed from polysilicon, and the gate insulating film 12 can be formed from a thermal oxide film of silicon.

In the termination section, an insulating film 13 is formed on the p-type base layer 9a, the third n-type pillar layer 6a, the third p-type pillar layer 7a, the second epitaxial layer 6b, and the n-type source layer 10a. The insulating film 13 can also be formed from a thermal oxide film of silicon. A gate wiring layer 15 made of polysilicon is formed at the boundary between the termination section and the device section on the insulating film 13. A channel stopper layer 16 made of polysilicon is formed on the chip end portion side of the third n-type pillar layer 6a and the third p-type pillar layer 7a on the insulating film 13. A $p^+$-type contact layer 11 is formed between the $n^+$-type source layers 10 in the surface of the p-type base layer 9 of the device section. A $p^+$-type contact layer 11a is formed in the surface of the p-type base layer 9a at the boundary between the device section and the termination section.

An interlayer insulating film 17 is formed on the gate electrode 14, the gate wiring layer 15, and the channel stopper layer 16. The interlayer insulating film 17 insulates the gate electrode 14, the gate wiring layer 15, and the channel stopper layer 16 from outside. A first opening 18 is formed between adjacent gate electrodes 14 so as to penetrate through the interlayer insulating film to the p-type base layer 9 and the $n^+$-type source layer 10 of the device section. A second opening 19 is formed at the boundary between the device section and the termination section so as to penetrate through the interlayer insulating film to the p-type base layer 9a.

A source electrode 25 is formed on the interlayer insulating film 17. The source electrode 25 is electrically connected to the $n^+$-source layer 10 and the $p^+$-type contact layer 11 through the first opening 18, and to the $p^+$-type contact layer 11a through the second opening 19. The source electrode is electrically connected to the p-type base layer 9 and the p-type base layer 9a through the $p^+$-type contact layer 11 and the $p^+$-type contact layer 11a. A drain electrode 24 is formed on the surface of the $n^+$-type drain layer 1 on the opposite side of the first drift layer 5. The drain electrode 24 is electrically connected to the $n^+$-type drain layer 1.

A gate metal wiring layer 26 is electrically connected to the gate wiring layer 15 through an opening 20 of the interlayer insulating film 17. A channel stopper electrode 27 is electrically connected to the channel stopper layer 16 through an opening 21 of the interlayer insulating film 17, and electrically connected to the $n^+$-type source layer 10a through an opening 22 of the interlayer insulating film 17. Thus, the channel stopper layer 16, the channel stopper electrode 27, and the $n^+$-type source layer 10a are electrically connected and maintained at the same potential as the drain electrode through the chip end portion having high conductivity.

Next, the operation of the MOSFET 100 according to this embodiment is described. When a voltage exceeding the threshold is applied to the gate electrode 14, the MOSFET 100 is turned on. Then, a channel layer is formed in the p-type base layer 9 between the $n^+$-type source layer 10 and the second n-type pillar layer 6. When a positive potential with reference to the source electrode 25 is applied to the drain electrode 24, a current flows from the drain electrode 24 to the source electrode 25 through the channel layer.

When a voltage lower than the threshold is applied to the gate electrode 14, the MOSFET 100 is turned off. Then, the channel layer disappears, and no current flows. The drain-source voltage increases, depleting the first drift layer and the second drift layer. When the drain-source voltage exceeds the breakdown voltage of the first and second drift layer, avalanche breakdown occurs. Electrons and holes generated thereby are ejected to the drain electrode 24 and the source electrode 25, respectively. Holes generated by the device section are ejected to the source electrode 25 through the first opening 18. Holes generated by the termination section are ejected to the source electrode 25 through the second opening 19 located at the boundary between the device section and the termination section. With regard to the cross-sectional area for passing the hole current, the second opening 19 is smaller than the first opening 18 formed entirely in the device section. Hence, if the breakdown voltage is equal in the device section and the termination section, the current of holes generated by the avalanche of the termination section causes current concentration in the second opening 19 located at the boundary between the device section and the termination section. This current concentration is likely to cause destruction. That is, the termination section has lower withstand capability.

In the MOSFET 100 according to this embodiment, the drift layer has a two-stage structure of the first drift layer 5 and the second drift layer 8. Each drift layer includes a super junction structure in which n-type pillar layers and p-type pillar layers are alternately and repeatedly arranged in the horizontal direction of the drift layer. The second drift layer 8 includes a super junction structure in both the device section and the termination section. In contrast, in the first drift layer 5, although the device section includes a super junction structure, the termination section includes no super junction structure. That is, the first drift layer 5 includes an $n^-$-epitaxial layer 2 in the termination section instead of the super junction structure in which n-pillar layers and p-pillar layers are repeatedly arranged.

The super junction structure is formed so that the amount of n-type impurity of the n-type pillar layer is equal to the amount of p-type impurity of the p-type pillar layer. Thus, the super junction structure artificially functions as a low impurity concentration layer. However, the balance between the amount of n-type impurity and the amount of p-type impurity is likely to be lost due to manufacturing variations. If the balance of the amount of impurity is lost, the super junction structure artificially functions as an n-type or p-type impurity layer. This makes the super junction structure less likely to be completely depleted when the MOSFET is turned off. Thus, the breakdown voltage decreases. In contrast, the impurity concentration of the $n^-$-epitaxial layer 2 is set lower so that the $n^-$-epitaxial layer 2 is likely to be completely depleted when the MOSFET is turned off. This reduces the influence of manufacturing variations on the depletion of the $n^-$-epitaxial layer 2. That is, the breakdown voltage is stable against manufacturing variations.

Here, if a super junction is formed in both the device section and the termination section of the first drift layer 5, then because the device section and the termination section have an equal breakdown voltage, the avalanche in the termination section occurs simultaneously with the avalanche in the device section. In this case, the termination section has lower withstand capability for the avalanche current. Hence, the MOSFET is destroyed in the termination section, and has lower withstand capability. However, in the MOSFET 100 of this embodiment, instead of the super junction, the termination section of the first drift layer includes an $n^-$-epitaxial layer 2 having a breakdown voltage stable against manufacturing variations. Hence, avalanche occurs in SJ1 of the device section having a lower breakdown voltage. Because the device section has higher withstand capability for avalanche, the withstand capability of the MOSFET 100 is improved.

In the MOSFET 100, the total thickness of the first drift layer and the second drift layer determines the breakdown voltage. In the MOSFET 100 according to this embodiment, the breakdown voltage is assumed to be approximately 600 V. As an example, the thickness of the first drift layer is 30 μm. The first n-type pillar layer and p-type pillar layer have a thickness of approximately 20-25 μm, and are formed by coupling of two n-type layers and p-type layers, respectively. The second drift layer, the second n-type pillar layer and p-type pillar layer, and the third n-type pillar layer and p-type pillar layer are formed with a thickness of 20 μm. However, these settings can be changed by design choice for the breakdown voltage. Furthermore, the first n-type pillar layer 3 and the first p-type pillar layer 4 are formed by coupling of two n-type layers and p-type layers, respectively, in the Y direction. However, this may also be changed by design choice. They may be formed by coupling of three or more n-type layers and p-type layers, respectively.

In the MOSFET 100 according to this embodiment, it is only necessary that the amount of n-type impurity of the first n-type pillar layer 3 and the amount of p-type impurity of the first p-type pillar layer 4 in the first drift layer are set equal, that the amount of n-type impurity of the second n-type pillar layer 6 and the amount of p-type impurity of the second p-type pillar layer 7 in the second drift layer are set equal, and that the amount of n-type impurity of the third n-type pillar layer 6a and the amount of p-type impurity of the third p-type pillar layer 7a in the second drift layer are set equal. The relationship between the impurity concentration in the first drift layer and the impurity concentration in the second drift layer is arbitrary. However, although the description with reference to specific examples is omitted, a MOSFET 101 according to a variation of this embodiment can be configured so that the n-type and p-type impurity concentration in the super junctions SJ2, SJ3 of the second drift layer is higher than that in the super junction SJ1 of the first drift layer. For instance, in the balanced state of the amount of n-type impurity and the amount of p-type impurity (the state of the amounts of n-type and p-type impurity being equal to each other) in each of the super junctions SJ1, SJ2, SJ3, the amount of n-type impurity of each n-type pillar layer and the amount of p-type impurity of each p-type pillar layer of the super junctions SJ2, SJ3 can be made larger than the amount of n-type impurity of the n-type pillar layer and the amount of p-type impurity of the p-type pillar layer of the super junction SJ1.

When the MOSFET 100 is turned off, the drain-source voltage gradually increases. If a super junction structure is used in the drift layer, then in the stage of low drain-source voltage, the gate-drain capacitance $C_{GD}$ rapidly decreases.

This causes noise to be generated from the gate electrode. As described above, by setting the n-type impurity concentration of the n-type pillar layer and the p-type impurity concentration of the p-type pillar layer in the second drift layer to be higher than those in the first drift layer, the depletion of the second drift layer in the stage of low drain-source voltage is suppressed. This suppresses the rapid decrease of the gate-drain capacitance $C_{GD}$. As a result, in the MOSFET 101 according to the variation of this embodiment, generation of noise from the gate is suppressed. This variation is also applicable to the following embodiments.

In the MOSFET 100 according to this embodiment, the drift layer has a two-stage structure of the first drift layer and the second drift layer. Each drift layer includes a super junction structure in which n-pillar layers and p-pillar layers are alternately and repeatedly arranged in the horizontal direction of the drift layer. The second drift layer includes a super junction structure in both the device section and the termination section. In contrast, in the first drift layer, although the device section includes a super junction structure, the termination section includes no super junction structure. That is, the first drift layer includes an n⁻-epitaxial layer 2 in the termination section instead of the structure in which n-pillar layers and p-pillar layers are repeatedly arranged.

As described with reference to the manufacturing method described later, the n-type pillar layer 3 and the p-type pillar layer 4 of the first drift layer are formed by the multi-epitaxy process of repeating epitaxial growth of the first epitaxial layer 2 and ion implantation of n-type impurity and p-type impurity. The n-type pillar layer 3 is formed from a plurality of n-type diffusion layers coupled to each other in the Y direction. Each of the plurality of n-type diffusion layers has a maximum of n-type impurity concentration inside or in the central portion thereof in the Y direction. Furthermore, the p-type pillar layer 4 is formed from a plurality of p-type diffusion layers coupled to each other in the Y direction. Each of the plurality of p-type diffusion layers has a maximum of p-type impurity concentration inside or in the central portion thereof in the Y direction. The p-type pillar layers 7, 7a of the second drift layer are buried in a first and second trench, respectively, formed in the second epitaxial layer 6b. The portions of the second epitaxial layer 6b sandwiched between the p-type pillar layers 7, 7a are formed as n-type pillar layers 6, 6a, respectively, of the second drift layer.

If, as in this second drift layer, the super junction SJ1 of the first drift layer 5 is formed from p-type pillar layers buried in trenches, then because the n-type pillar layer is formed from the first epitaxial layer 2, the n⁻-type epitaxial layer having low impurity concentration cannot be formed in the termination section of the first drift layer. Furthermore, if the n-type pillar layer 3 and the p-type pillar layer 4 of the first drift layer 5 are both formed from pillar layers buried in trenches, then the manufacturing process is complicated and makes the manufacturing difficult. Furthermore, if the super junction structure of the second drift layer 8 is formed from diffusion layers using the multi-epitaxy process for forming the super junction of the first drift layer, then the number of manufacturing steps increases, and the manufacturing cost increases.

In the MOSFET 100 according to this embodiment, the first super junction of the first drift layer is formed from n-type pillar layers made of a plurality of n-type diffusion layers and p-type pillar layers made of a plurality of p-type diffusion layers. Furthermore, the second and third super junction of the second drift layer are formed from p-type pillar layers buried in trenches and n-type pillar layers sandwiched therebetween. This makes it possible to realize the MOSFET 100 by an easy manufacturing process. The MOSFET 100 can include the first super junction structure SJ1 in the device section. Furthermore, the MOSFET 100 can include the first drift layer 5 including an epitaxial layer 2 having low impurity concentration in the termination section. Furthermore, the MOSFET 100 can include the second drift layer 8 including the second super junction SJ2 and the third super junction SJ3 in the device section and the termination section, respectively.

In the second drift layer 8 of the MOSFET 100 according to this embodiment, the second n-type pillar layer 6 and the second p-type pillar layer 7 of the device section, and the third n-type pillar layer 6a and the third p-type pillar layer 7a of the termination section are formed so that the amount of n-type impurity and the amount of p-type impurity are equal to each other. Furthermore, the second n-type pillar layer 6 and the third n-type pillar layer 6a are like n-type pillar layers, and the second p-type pillar layer 7 and the third p-type pillar layer 7a are like p-type pillar layers. However, depending on the design, by changing e.g. the width in the X direction of each pillar layer, the third n-type pillar layer 6a and the third p-type pillar layer 7a may be formed so that the amount of impurity is different from that of the second n-type pillar layer 6 and the second p-type pillar layer 7, respectively.

Next, a method for manufacturing the MOSFET 100 according to this embodiment is described with reference to FIGS. 4 to 9. FIGS. 4 to 9 are main part sectional views showing the process for manufacturing the MOSFET 100 according to this embodiment. In each of these figures, the sectional view of FIG. 2 is further simplified. The method will be described with a brief comparison between the main parts of the device section and the termination section.

Figure 4:
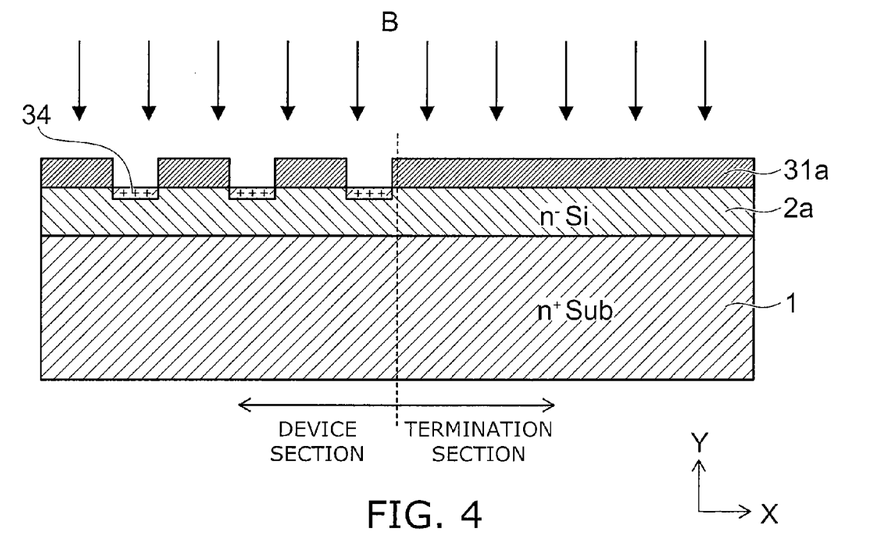
FIGS. 4 to 9 are main part sectional views showing the process for manufacturing the power semiconductor device according to the first embodiment.

As shown in FIG. 4, an n⁺-type silicon substrate with the n-type impurity concentration on the order of $10^{19}/cm^3$ is used as an n⁺-type drain layer 1. On the n⁺-type drain layer 1, a portion (first layer) 2a of an n⁻-type first epitaxial layer 2 having low impurity concentration ($10^{13}$–$10^{14}/cm^3$) is formed by epitaxial growth of silicon. The thickness of the first layer 2a of the n⁻-type first epitaxial layer 2 is 15 μm. A photoresist 31a is formed on the surface of the first layer 2a of the n⁻-type first epitaxial layer 2. Only in the device section, the photoresist 31a includes openings spaced with a prescribed spacing in the X direction. By ion implantation, boron (B) as p-type impurity is implanted through the openings of the aforementioned photoresist 31a into the surface of the first layer 2a of the n⁻-type first epitaxial layer 2. Thus, boron implantation layers (second-conductivity-type impurity layers) 34 are formed. The condition of ion implantation is that, for instance, the dose amount of boron is several $10^{13}/cm^2$ and the acceleration voltage is several hundred kV. Here, besides ion implantation, boron can also be implanted by gas phase diffusion from an atmosphere containing a raw material gas of boron, or by solid phase diffusion from a solid containing boron.

Figure 5:
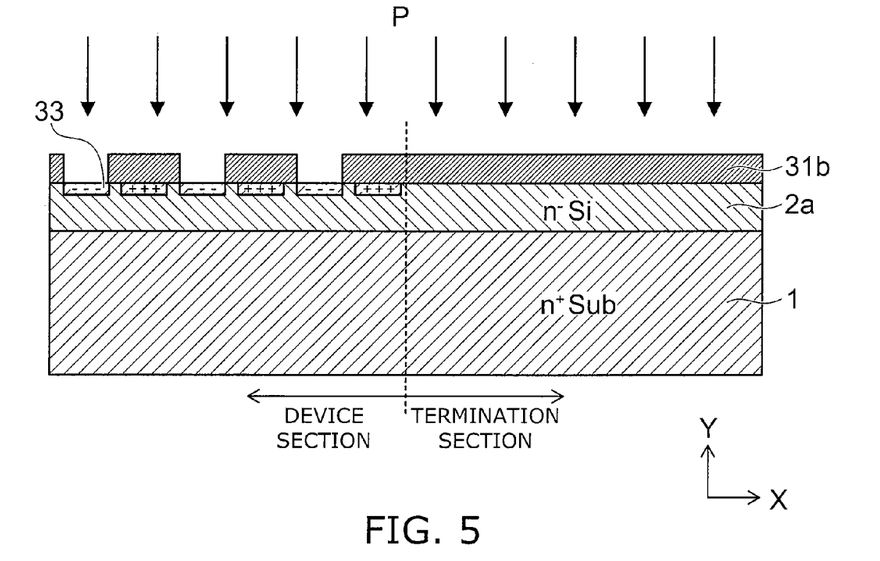

Next, as shown in FIG. 5, the photoresist 31a is removed. Then, another photoresist 31b is formed on the surface of the first layer 2a of the n⁻-type first epitaxial layer 2. Only in the device section, the photoresist 31b includes openings spaced with a prescribed spacing in the X direction and located between adjacent ones of the aforementioned boron implantation layers 34. By ion implantation, phosphorus (P) as n-type impurity is implanted through the openings of the aforementioned photoresist 31b into the surface of the first layer 2a of the n⁻-type first epitaxial layer 2. Thus, phosphorus implantation layers (first-conductivity-type impurity layers) 33 are formed. The condition of ion implantation is that, for instance, the dose amount of phosphorus is several $10^{13}/cm^2$ and the acceleration voltage is several hundred kV. Here, besides ion implantation, phosphorus can also be implanted by gas phase diffusion from an atmosphere containing a raw material gas of phosphorus, or by solid phase diffusion from a solid containing phosphorus.

Figure 6:
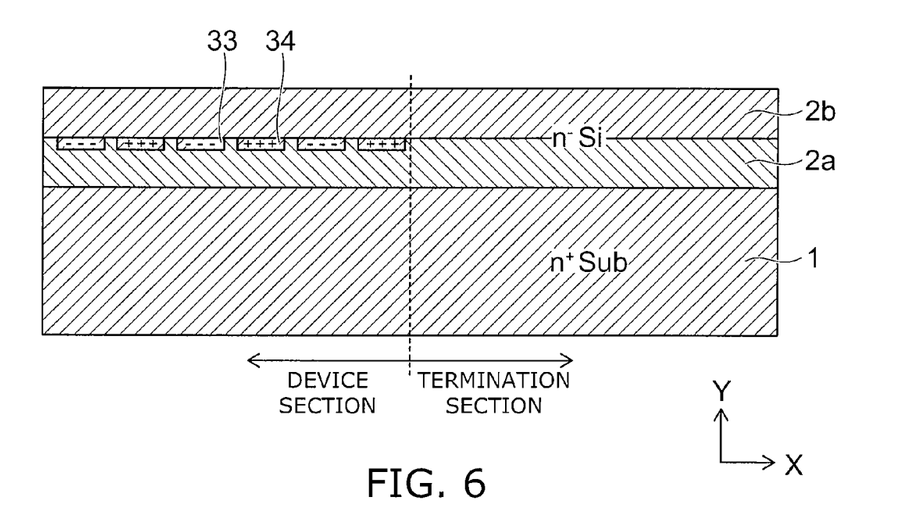

After the photoresist 31b is removed, as shown in FIG. 6, a second layer 2b of the n⁻-type first epitaxial layer 2 is further formed by epitaxial growth. The thickness of the second layer 2b of the n⁻-type first epitaxial layer 2 is e.g. 10 µm.

Figure 7:
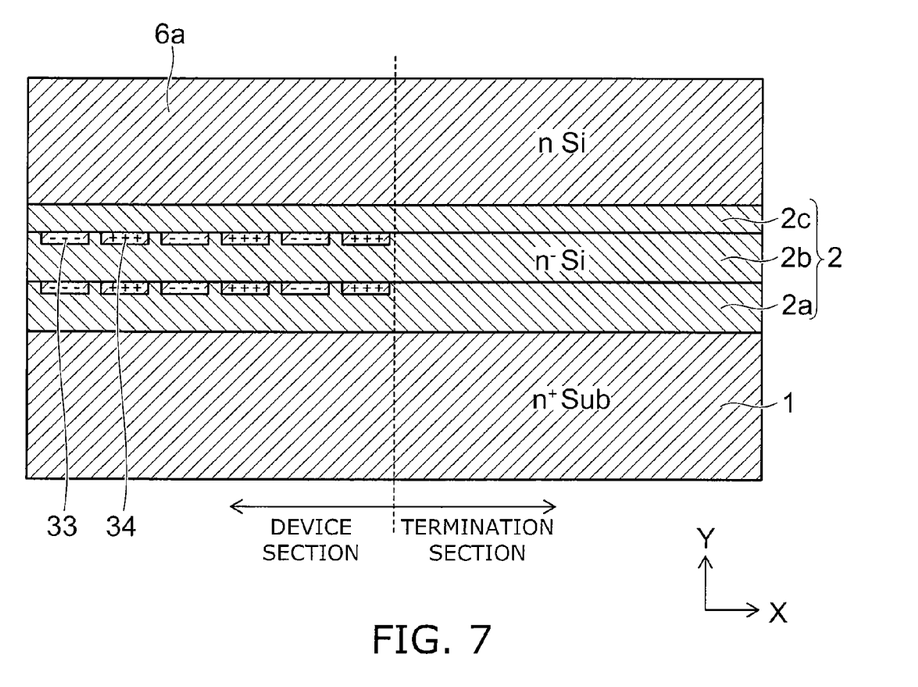

As shown in FIG. 7, in the surface of the second layer 2b of the n⁻-type first epitaxial layer 2, the formation of boron implantation layers 34 by ion implantation through the aforementioned photoresist 31a shown in FIG. 4, and the formation of phosphorus implantation layers 33 by ion implantation through the photoresist 31b shown in FIG. 5 are performed. Here, the formation of the second layer 2b of the n⁻-type first epitaxial layer 2, the formation of boron implantation layers 34, and the formation of phosphorus implantation layers 33 described above can be collectively regarded as a unit process. In accordance with the design for increasing the breakdown voltage of the MOSFET, this unit process can be further repeated a plurality of times. The MOSFET 100 according to this embodiment includes a two-stage structure of boron implantation layers 34 and phosphorus implantation layers 33 as the result of performing this unit process once. Furthermore, a third layer 2c of the n⁻-type first epitaxial layer 2 is formed by epitaxial growth. The thickness of the third layer 2c of the n⁻-type first epitaxial layer 2 is e.g. 5 µm. Thus, a first drift layer 5 is formed. The first drift layer 5 has a structure in which two stages of boron implantation layers 34 and phosphorus implantation layers 33 are alternately arranged along the X direction in the n⁻-type first epitaxial layer 2. The total thickness of the n⁻-type first epitaxial layer 2 is 30 µm. The boron implantation layer 34 and the phosphorus implantation layer 33 are formed with the centers thereof located at depths of 5 µm and 15 µm from the surface of the n⁻-type first epitaxial layer 2.

Figure 8:
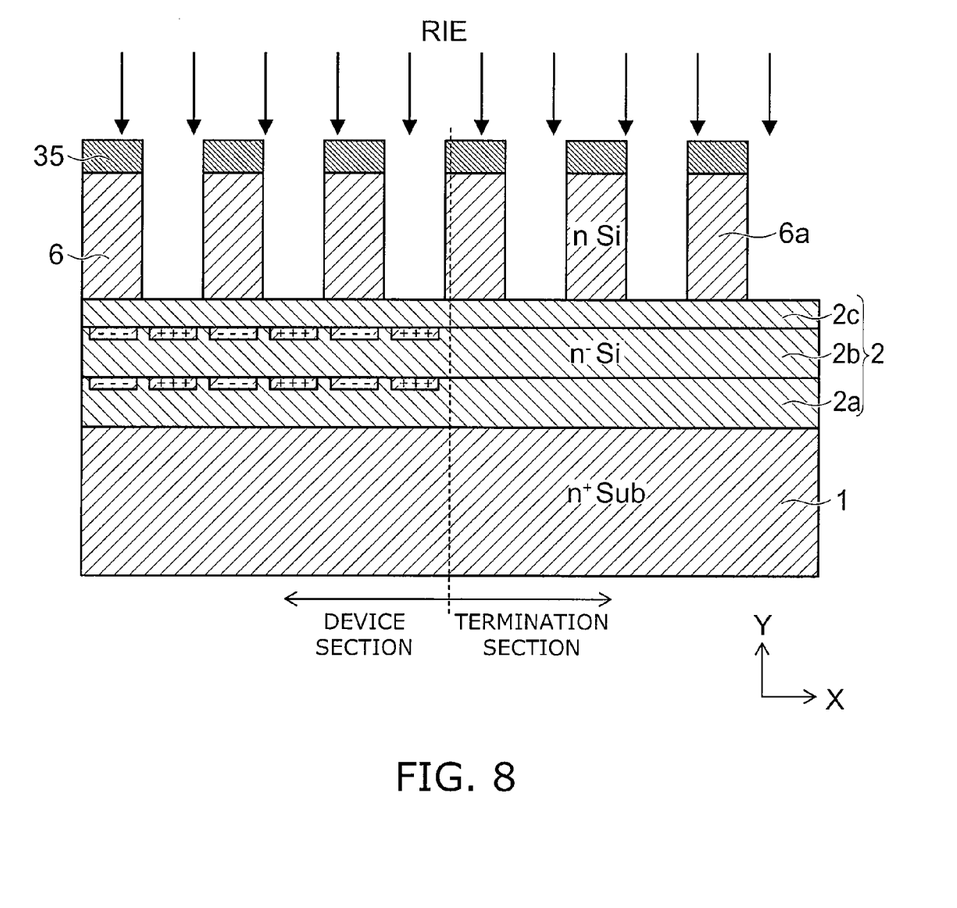

Next, an n-type second epitaxial layer 6b is formed by epitaxial growth of silicon on the first drift layer 5. The thickness of the n-type second epitaxial layer 6b is e.g. 20 µm. The n-type impurity concentration of the n-type second epitaxial layer 6b is e.g. $10^{15}$–$10^{16}$/cm³. As shown in FIG. 8, a photoresist 35 is formed on the surface of the n-type second epitaxial layer 6b. In the device section and the termination section, the photoresist 35 includes openings spaced in the X direction and corresponding to positions where the second and third p-type pillar layers described later are to be formed. Here, in the MOSFET 100 according to this embodiment, the second and third p-type pillar layers are like p-type pillar layers. Hence, the opening widths in the X direction in the device section and the termination section are equal.

The n-type second epitaxial layer 6b is etched by RIE (Reactive Ion Etching) through the openings of the aforementioned photoresist 35. As a result, first trenches are formed in the device section of the n-type second epitaxial layer 6b, and second trenches are formed in the termination section of the n-type second epitaxial layer 6b. The first and second trenches are formed so as to penetrate through the n-type second epitaxial layer 6b to the first drift layer 5.

Figure 9:
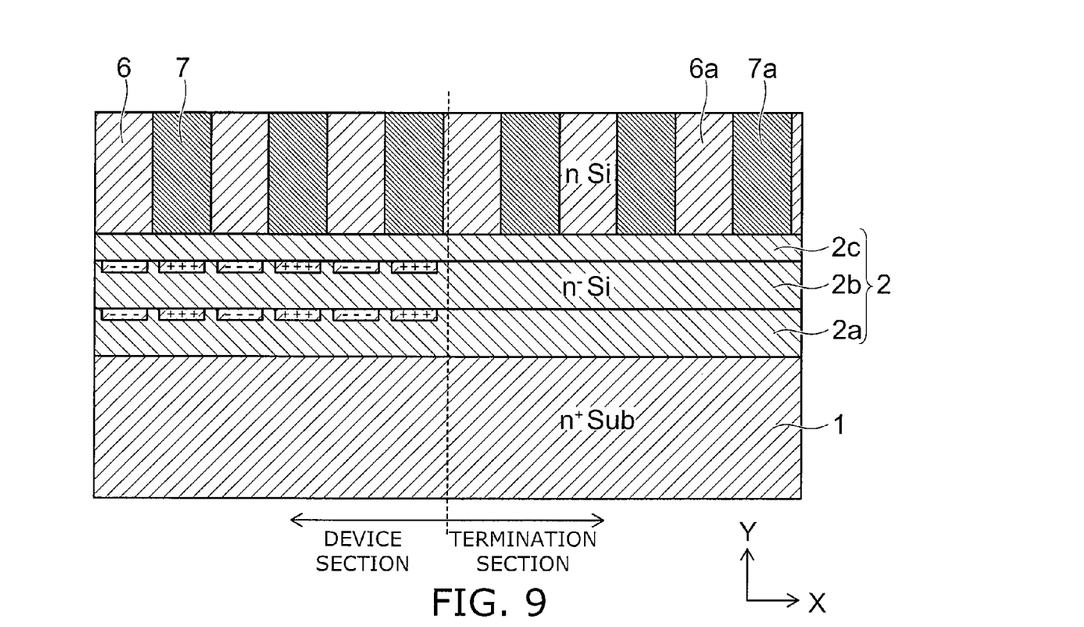

After the photoresist 35 is removed, as shown in FIG. 9, a p-type silicon layer is buried by epitaxial growth in the first trenches and the second trenches formed in the n-type second epitaxial layer 6b. As a result, second p-type pillar layers 7 buried in the first trenches are formed in the device section, and third p-type pillar layers 7a buried in the second trenches are formed in the termination section. The portion of the n-type second epitaxial layer 6b sandwiched between adjacent second p-type pillar layers is a second n-type pillar layer 6. The portion of the n-type second epitaxial layer 6b sandwiched between adjacent third p-type pillar layers 7a is a third n-type pillar layer 6a. Here, the doping condition for p-type impurity in the aforementioned epitaxial growth of p-type silicon buried in the trenches is determined so that the amount of p-type impurity in the second and third p-type pillar layers is equal to the amount of n-type impurity in the second and third n-type pillar layers. Thus, a second drift layer 8 including the second n-type pillar layers 6, the second p-type pillar layers 7, the third n-type pillar layers 6a, and the third p-type pillar layers 7a is formed in the n-type second epitaxial layer 6b.

Next, in a step not shown, a heat treatment step is performed. In this heat treatment step, in each of the two-stage phosphorus implantation layers 33 in the first drift layer, phosphorus atoms therein are diffused. Thus, the phosphorus implantation layers 33 are turned into n-type diffusion layers and coupled to each other in the Y direction. As a result, a first n-type pillar layer 3 with the n-type diffusion layers coupled in the Y direction is formed in the first drift layer 5. Likewise, in each of the two-stage boron implantation layers 34 in the first drift layer, boron atoms therein are diffused. Thus, the boron implantation layers 34 are turned into p-type diffusion layers and coupled to each other in the Y direction. As a result, a first p-type pillar layer 4 with the p-type diffusion layers coupled in the Y direction is formed in the first drift layer 5. Furthermore, the first n-type pillar layer 3 is coupled to the second n-type pillar layer 6 by diffusion of phosphorus. The first p-type pillar layer 4 is coupled to the second p-type pillar layer 7 by diffusion of boron.

Thus, a first super junction structure SJ1 is formed in the device section in the first drift layer, and an n⁻-type first epitaxial layer 2 is formed in the termination section in the first drift layer. Furthermore, a second super junction SJ2 and a third super junction SJ3 are formed in the device section and the termination section, respectively, in the second drift layer 8.

Subsequently, although the detailed description with reference to the drawings is omitted, the manufacturing process for forming the device section of a normal MOSFET is performed. For instance, an insulating film 13 is formed on the second drift layer 8 of the termination section by thermal oxidation. A gate electrode 14 is formed from polysilicon via a gate insulating film 12 on the n⁺-type source layer 10, the p-type base layer 9, and the second n-type pillar layer 6 between adjacent p-type base layers 9 of the device section. In the same process as the gate electrode 14, a gate wiring layer 15 and a channel stopper layer 16 are formed from polysilicon. An interlayer insulating film 17 of silicon oxide is formed by e.g. CVD (Chemical Vapor Deposition) on the gate insulating film 12, the gate electrode 14, the gate wiring layer 15, the insulating film 13, and the channel stopper layer 16. Subsequently, a first opening 18 is formed in the interlayer insulating film 17 between the gate electrodes 14 of the device section so as to reach the p-type base layer 9 and the n⁺-type source layer 10. A second opening 19 is formed in the interlayer insulating film 17 at the boundary between the device section and the termination section so as to reach the p-type base layer 9 and the n⁺-type source layer 10. Furthermore, an opening 20 reaching the gate wiring layer 15, an opening 21 reaching the channel stopper layer 16, an opening 22 reaching the p-type base layer 9b, and an opening 23 in the chip end portion are formed. The p-type base layer 9 is formed in the device section, the p-type base layer 9a is formed at the boundary between the device section and the termination section, and the p-type base layer 9b is formed in the chip end portion, all by the same step for diffusion of p-type impurity.

The dose amount for ion implantation of p-type impurity can be set on the order of e.g. $10^{13}/cm^2$. Next, the n$^+$-type source layer 10 is formed in the device section, and the n$^+$-type source layer 10a is formed in the chip end portion, by diffusion of n-type impurity. The dose amount for ion implantation of n-type impurity can be set on the order of e.g. $10^{15}/cm^2$.

A drain electrode 24 is formed so as to be electrically connected to the n$^+$-type drain layer 1. A source electrode 25 is formed so as to be electrically connected to the p-type base layer 9 and the n$^+$-type source layer 10 through the first opening and the second opening. A gate metal wiring layer 26 is formed so as to be electrically connected to the gate wiring layer through the opening 20. A channel stopper electrode 27 is formed so as to be electrically connected to the channel stopper layer and the n$^+$-type source layer 10a through the opening 21 and the opening 22, respectively. The drain electrode 24, the source electrode 25, the gate metal wiring layer 26, and the channel stopper electrode 27 can be made of a metal material, such as aluminum, copper, and gold.

By using the manufacturing method described above, the MOSFET 100 according to this embodiment shown in FIGS. 1 and 2 can be manufactured. In the above description, the manufacturing method includes the step of forming the second p-type pillar layer 7 and the third p-type pillar layer 7a by burying a p-type silicon layer in the first and second trench, respectively, by epitaxial growth. Here, if the aspect ratio of the first and second trench is too high, voids may be formed in the second p-type pillar layer 7 and the third p-type pillar layer 7a. In this case, it is possible to use a structure in which the width in the X direction of the first and second trenches is widened toward the second electrode (with the distance from the first electrode). Then, the p-type silicon layer is buried more favorably in the trench by epitaxial growth. This can suppress the generation of voids in the second p-type pillar layer 7 and the third p-type pillar layer 7a.

Second Embodiment

Figure 10:
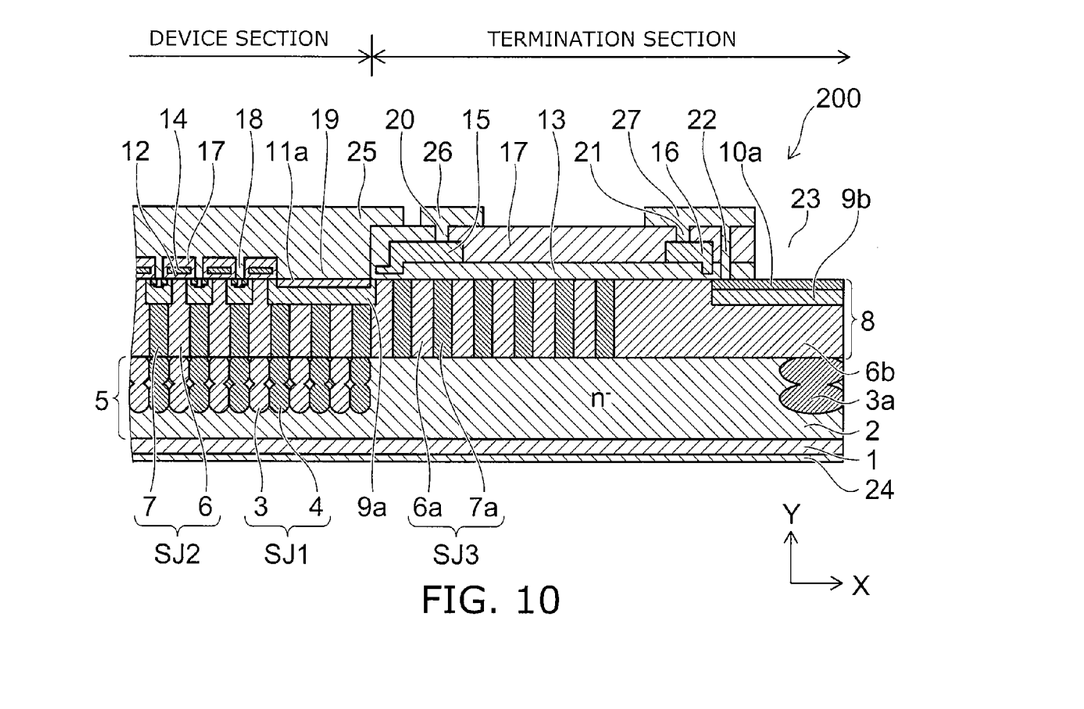
FIG. 10 is a main part sectional view of a power semiconductor device according to a second embodiment.

A MOSFET 200 according to a second embodiment is described with reference to FIG. 10. FIG. 10 is a main part sectional view of a power semiconductor device according to the second embodiment. The portions having the same configuration as those described in the first embodiment are labeled with like reference numerals or symbols, and the description thereof is omitted. Differences from the first embodiment are primarily described.

The power semiconductor device according to this embodiment is a MOSFET similar to that of the first embodiment. The top view of the chip is the same as that of the MOSFET 100 according to the first embodiment shown in FIG. 1. FIG. 10 is a sectional view taken along A-A of FIG. 1. The MOSFET 200 according to this embodiment is different from the MOSFET 100 according to the first embodiment in the following point. In the MOSFET 200, in the chip end portion, an n-type pillar layer 3a is further formed in the n$^-$-type first epitaxial layer 2. The n-type pillar layer 3a is formed from two second n-type layers coupled to each other in the Y direction. These two second n-type layers have a maximum of n-type impurity concentration inside or in the central portion of each second n-type layer in the Y direction. Furthermore, in the coupling portion of these two second n-type layers, the n-type impurity concentration has a minimum. That is, the pillar layer 3a has an impurity concentration distribution with maxima and minima of impurity concentration repeated along the Y direction. The aforementioned second n-type layer is a diffusion layer having a maximum of n-type impurity concentration inside or in the central portion thereof, and formed by ion implantation and heat treatment. This pillar layer 3a is connected to the second epitaxial layer 6b in the second drift layer and located immediately below the p-type base layer 9b. The second n-type layer of the pillar layer 3a is a diffusion layer like the first n-type layer constituting the first n-type pillar layer 3, and can be formed integrally with the first n-type layer. That is, the second n-type layer has a maximum in the first epitaxial layer 2 at the same depth from the surface as the first n-type layer. The rest of the structure is the same as that of the MOSFET 100 according to the first embodiment.

Also with regard to the manufacturing method, the MOSFET 200 can be manufactured by the same manufacturing method as the MOSFET according to the first embodiment. In the manufacturing steps shown in FIGS. 5 and 7, in forming the first n-type pillar layer 3 of the first drift layer of the MOSFET 200, an opening of the photoresist 31b can be further provided at a position adjacent to the chip end portion. Thus, simultaneously with the first n-type layer of the first n-type pillar layer 3, the second n-type layer of the pillar layer 3a can be formed. That is, in the steps shown in FIGS. 5 and 7, phosphorus implantation layers (second n-type impurity layers) for forming the second n-type layers of the pillar layer 3a are formed in two stages in the Y direction in the chip end portion simultaneously with the phosphorus implantation layers 33 for forming the first n-type layers of the first n-type pillar layer 3. In the subsequent heat treatment, phosphorus is diffused to form an n-type pillar layer 3a with the second n-type layers coupled in the Y direction.

Also in the MOSFET 200 of this embodiment, the drift layer has a two-stage structure of the first drift layer and the second drift layer. Each drift layer includes a super junction structure in which n-pillar layers and p-pillar layers are alternately and repeatedly arranged in the horizontal direction of the drift layer. The second drift layer includes a super junction structure in both the device section and the termination section. In contrast, in the first drift layer, although the device section includes a super junction structure, the termination section includes an n$^-$-epitaxial layer 2 instead of the super junction structure in which n-pillar layers and p-pillar layers are repeatedly arranged. Thus, the drift layer is composed of the first drift layer 5 and the second drift layer 8 described above. Accordingly, like the MOSFET 100 according to the first embodiment, the MOSFET 200 according to this embodiment also causes avalanche in the device section having higher withstand capability for avalanche. Hence, the withstand capability of the MOSFET 200 is improved.

Furthermore, also in the MOSFET 200 according to this embodiment, the first super junction SJ1 of the aforementioned first drift layer 5 is formed from n-type pillar layers 3 made of a plurality of n-type diffusion layers and p-type pillar layers 4 made of a plurality of p-type diffusion layers. Furthermore, the second and third super junction SJ2, SJ3 of the aforementioned second drift layer 8 are formed from p-type pillar layers buried in trenches and n-type pillar layers sandwiched therebetween. Thus, like the MOSFET 100 according to the first embodiment, the MOSFET 200 according to this embodiment can be manufactured by an easy manufacturing process.

Furthermore, in the MOSFET 200 according to this embodiment, an n-type pillar layer 3a is formed adjacent to the chip end portion of the first epitaxial layer 2. When the MOSFET 200 is turned off, with the increase of the voltage between the drain and source electrode, a depletion layer extends from the device section toward the chip end portion. By preventing this depletion layer from reaching the chip end portion, the n-type pillar layer 3a prevents leakage current in the chip end portion. Thus, the MOSFET 200 according to this embodiment is less prone to destruction in the chip end portion, and has higher reliability, than the MOSFET 100 according to the first embodiment.

The embodiments of the invention have been described above. However, the features described in the embodiments and variations can be practiced also in combination. In the above description, a MOSFET is taken as an example of the high power semiconductor device. However, the invention is not limited thereto, but applicable to the drift layer of other high power semiconductor devices such as an SBD (Schottky barrier diode) and IGBT (insulated gate bipolar transistor). For instance, in the case of an SBD, in the structure shown in FIG. 2, instead of providing a gate electrode and a gate insulating film in the device section, the source electrode is formed in Schottky contact with the second n-type pillar layer 6 on the surface of the second drift layer. In the case of an SBD, the gate wiring layer 15 in FIG. 2 can function as a field plate electrode. In the case of an IGBT, a p$^+$-type collector layer is provided between the n$^+$-type drain layer 1 and the drain electrode 24 in the structure of FIG. 2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A power semiconductor device including a device section in which a current flows in a vertical direction between a first electrode and a second electrode opposed to each other, and a termination section surrounding the device section in a horizontal plane orthogonal to the vertical direction, the device comprising:

a first semiconductor layer of a first-conductivity-type impurity;

a first drift layer formed on the first semiconductor layer and including a first epitaxial layer of the first-conductivity-type impurity, a plurality of first first-conductivity-type pillar layers of the first-conductivity-type impurity, and a plurality of first second-conductivity-type pillar layers of a second-conductivity-type impurity, the first epitaxial layer having a lower concentration of first-conductivity-type impurity than the first semiconductor layer, the plurality of first first-conductivity-type pillar layers and the plurality of first second-conductivity-type pillar layers alternately and repeatedly arranged in a first direction parallel to the horizontal plane only in the device section in the first epitaxial layer, and the plurality of first first-conductivity-type pillar layers having a higher concentration of the first-conductivity-type impurity than the first epitaxial layer;

a second drift layer formed on the first drift layer and including a second epitaxial layer of the first-conductivity-type impurity, a plurality of second second-conductivity-type pillar layers, a plurality of second first-conductivity-type pillar layers, a plurality of third second-conductivity-type pillar layers, and a plurality of third first-conductivity-type pillar layers, the second epitaxial layer of the first-conductivity-type impurity having a higher concentration of the first-conductivity-type impurity than the first epitaxial layer, the plurality of second second-conductivity-type pillar layers spaced along the first direction in the device section in the second epitaxial layer and connected to the first second-conductivity-type pillar layers, the plurality of second first-conductivity-type pillar layers made of the second epitaxial layer sandwiched between adjacent ones of the second second-conductivity-type pillar layers and connected to the first first-conductivity-type pillar layers, the plurality of third second-conductivity-type pillar layers spaced along the first direction in the termination section in the second epitaxial layer and arranged on the first epitaxial layer, and the plurality of third first-conductivity-type pillar layers made of the second epitaxial layer sandwiched between adjacent ones of the third second-conductivity-type pillar layers and arranged on the first epitaxial layer;

a plurality of second-conductivity-type base layers selectively formed in a surface of the second drift layer in the device section and electrically connected to the second second-conductivity-type pillar layers;

a first-conductivity-type source layer selectively formed in a surface of the second-conductivity-type base layers; and a gate electrode formed via a gate insulating film on the first-conductivity-type source layer, the second-conductivity-type base layers, and the second first-conductivity-type pillar layers, the first electrode being electrically connected to a surface of the first semiconductor layer on opposite side of the first drift layer, and the second electrode being electrically connected to the first-conductivity-type source layer and the second-conductivity-type base layers.

2. The device according to claim 1, wherein in the first first-conductivity-type pillar layers in the first drift layer, concentration distribution of the first-conductivity-type impurity in the vertical direction has a plurality of first maxima, in the first second-conductivity-type pillar layers in the first drift layer, concentration distribution of the second-conductivity-type impurity in the vertical direction has as many second maxima as the first maxima, and in the second second-conductivity-type pillar layers in the second drift layer, concentration distribution of the second-conductivity-type impurity in the vertical direction does not have a plurality of maxima.

3. The device according to claim 1, wherein each of the first first-conductivity-type pillar layers in the first drift layer is formed from a plurality of first first-conductivity-type layers coupled in the vertical direction, and each of the first first-conductivity-type layers has a maximum of concentration of the first-conductivity-type impurity in the vertical direction inside or in a central portion of each first first-conductivity-type layer, each of the first second-conductivity-type pillar layers in the first drift layer is formed from a plurality of first second-conductivity-type layers coupled in the vertical direction, and each of the first second-conductivity-type layers has as many first second-conductivity-type layers coupled in the vertical direction as the first first-conductivity-type layers has coupled in the vertical direction, and each of the first second-conductivity-type layers has a maximum of concentration of the second-conductivity-type impurity in the vertical direction inside or in a central portion of each first second-conductivity-type layer, and each second second-conductivity-type pillar layer in the second drift layer is a single semiconductor layer including the second-conductivity-type impurity.

4. The device according to claim 3, wherein the plurality of first first-conductivity-type layers are diffusion layers having a maximum of concentration of the first-conductivity-type impurity inside or in the central portion of each first first-conductivity-type layer, and the plurality of first second-conductivity-type layers are diffusion layers having a maximum of concentration of the second-conductivity-type impurity inside or in the central portion of each first second-conductivity-type layer, and
each of the second second-conductivity-type pillar layers of the second drift layer is a buried layer buried in a trench formed in the second first-conductivity-type epitaxial layer.

5. The device according to claim 1, wherein each of the second first-conductivity-type pillar layers of the second drift layer has a higher concentration of the first-conductivity-type impurity than each of the first first-conductivity-type pillar layers of the first drift layer, and
each of the second second-conductivity-type pillar layers of the second drift layer has a higher concentration of second-conductivity-type impurity than each of the first second-conductivity-type pillar layers of the first drift layer.

6. The device according to claim 5, wherein each of the first first-conductivity-type pillar layers in the first drift layer is formed from a plurality of first first-conductivity-type layers coupled in the vertical direction, and each of the first first-conductivity-type layers has a maximum of concentration of the first-conductivity-type impurity in the vertical direction inside or in a central portion of each first first-conductivity-type layer,
each of the first second-conductivity-type pillar layers in the first drift layer is formed from a plurality of first second-conductivity-type layers coupled in the vertical direction, and each of the first second-conductivity-type layers has
as many first second-conductivity-type layers coupled in the vertical direction as the first first-conductivity-type layers has coupled in the vertical direction, and each of the first second-conductivity-type layers has a maximum of concentration of the second-conductivity-type impurity in the vertical direction inside or in a central portion of each first second-conductivity-type layer, and
each second second-conductivity-type pillar layer in the second drift layer is a single semiconductor layer including the second-conductivity-type impurity.

7. The device according to claim 6, wherein the plurality of first first-conductivity-type layers are diffusion layers having a maximum of concentration of the first-conductivity-type impurity inside or in the central portion of each first first-conductivity-type layer, and the plurality of first second-conductivity-type layers are diffusion layers having a maximum of concentration of the second-conductivity-type impurity inside or in the central portion of each first second-conductivity-type layer, and
each of the second second-conductivity-type pillar layers of the second drift layer is a buried layer buried in a trench formed in the second first-conductivity-type epitaxial layer.

8. The device according to claim 1, wherein a pillar layer formed from a plurality of second first-conductivity-type layers coupled in the vertical direction is further arranged in a portion of the first drift layer adjacent to a diced chip end portion, and each second first-conductivity-type layer has a maximum of concentration of the second-conductivity-type impurity in the vertical direction inside or in a central portion of each second first-conductivity-type layer.

9. The device according to claim 1, wherein width in the first direction of the second second-conductivity-type pillar layers of the second drift layer is made wider toward the second electrode.

10. The device according to claim 9, wherein the second first-conductivity-type pillar layers of the second drift layer have a higher concentration of the first-conductivity-type impurity than the first first-conductivity-type pillar layers of the first drift layer, and
the second second-conductivity-type pillar layers of the second drift layer have a higher concentration of second-conductivity-type impurity than the first second-conductivity-type pillar layers of the first drift layer.

11. The device according to claim 10, wherein each of the first first-conductivity-type pillar layers in the first drift layer is formed from a plurality of first first-conductivity-type layers coupled in the vertical direction, and each of the first first-conductivity-type layers has a maximum of concentration of the first-conductivity-type impurity in the vertical direction inside or in a central portion of each first first-conductivity-type layer,
each of the first second-conductivity-type pillar layers in the first drift layer is formed from a plurality of first second-conductivity-type layers coupled in the vertical direction, and each of the first second-conductivity-type layers has as many first second-conductivity-type layers coupled in the vertical direction as the first first-conductivity-type layers has coupled in the vertical direction, and each of the first second-conductivity-type layers has a maximum of concentration of the second-conductivity-type impurity in the vertical direction inside or in a central portion of each first second-conductivity-type layer, and
each second second-conductivity-type pillar layer in the second drift layer is a single semiconductor layer including the second-conductivity-type impurity.

12. The device according to claim 11, wherein the plurality of first first-conductivity-type layers are diffusion layers having a maximum of concentration of the first-conductivity-type impurity inside or in the central portion of each first first-conductivity-type layer, and the plurality of first second-conductivity-type layers are diffusion layers having a maximum of concentration of the second-conductivity-type impurity inside or in the central portion of each first second-conductivity-type layer, and
each of the second second-conductivity-type pillar layers of the second drift layer is a buried layer buried in a trench formed in the second first-conductivity-type epitaxial layer.

13. The device according to claim 1, further comprising: a collector layer of the second-conductivity-type impurity between the first electrode and the first semiconductor layer, wherein the collector layer of the second-conductivity-type impurity is electrically connected to the first electrode and the first semiconductor layer.

\* \* \* \* \*